VARIABLE FREQUENCY PHASE LOCKED FREQUENCY MULTIPLIER

Filed Oct. 18, 1965 2 Sheets-Sheet 1

INVENTOR.
HAROLD V. LIND,
BY Robert H. Himes
ATTORNEY.

March 7, 1967 H. V. LIND 3,308,393

VARIABLE FREQUENCY PHASE LOCKED FREQUENCY MULTIPLIER

Filed Oct. 18, 1965 2 Sheets-Sheet 2

VOLTAGE CHARACTERISTICS - IN PHASE LOCK

VOLTAGE CHARACTERISTICS - OUT OF PHASE LOCK

INVENTOR.
HAROLD V. LIND,
BY Robert H. Hines
ATTORNEY.

United States Patent Office 3,308,393

Patented Mar. 7, 1967

3,308,393

VARIABLE FREQUENCY PHASE LOCKED FREQUENCY MULTIPLIER

Harold V. Lind, Santa Ana, Calif., assignor to Hughes Aircraft Company, Culver City, Calif., a corporation of Delaware Filed Oct. 18, 1965, Ser. No. 497,067
4 Claims. (Cl. 331—14)

This invention relates to an apparatus capable of achieving phase lock multiplication over a wide range of frequencies and, more particularly, to an apparatus for providing reliable phase locking of a controlled oscillator at large multiples of a reference frequency.

In contemporary phase lock multipliers, controlled oscillations are generally compared to a harmonic from reference oscillations by means of a phase detector. This phase detector is essentially a peak detector which provides a direct-current output proportional to the phase difference between the reference oscillations and the controlled variable frequency oscillator frequencies. This system, however, has several disadavantages. A principal disadavantage is that the possibility exists for the controlled oscillator to lock at incorrect points such as ($n\pm½$) or A$n\pm⅓$) ($n$ being a positive integer) times the reference frequency. This erroneous locking is possible because a peak detector ignores pulses of one polarity. A bipolar averaging detector, on the other hand, overcomes this problem but has very low output. In addition, as the multiplying factor gets higher, the width of the reference frequency sampling pulses must necessarily get shorter. Nominally these sampling pulses must be less than one-quarter of a cycle of the controlled frequency. As a direct result, the amount of energy available from the phase detector decreases with increasing multiplying capability. In order to compensate for this decrease in energy from the phase detector, contemporary systems have employed direct-current amplifiers to increase the output signal from the phase detector to a level suitable to operate a reactance modulator used for shifting the controlled frequency to a lock point. The addition of a direct-current amplifier to the system adds complexity and power drain together with problems of long-term drift inherent in direct-current amplifiers.

It is therefore an object of the present invention to provide an improved wide range phase of lock multiplier apparatus.

Another object of the present invention is to provide a phase lock multiplier apparatus capable of operating through a wide range of frequencies.

Still another object of the present invention is to provide a wide range phase lock multiplier which does not require the use of a direct-current amplifier.

A further object of the present invention is to provide a phase lock multiplier that cannot generate an output signal of a frequency that is ($n\pm½$) or ($n\pm⅓$) times the reference frequency.

In accordance with the present invention, the phase error of the controlled variable frequency oscillator is converted into a biphase (0° and 180°) variable amplitude alternating-current signal that can be amplified and, in general, more easily handled. To accomplish this, a sampling gate is operated at a reference frequency, $f$, to sample the controlled variable frequency oscillator output, which is at approximately $nf$, and generates an output which occurs at the rate $f$ constituting a series of pulses having the polarity and amplitude of the sampled waveform. The amplitude and polarity of each output pulse is dependent upon the relative phase of the reference pulse relative to the controlled variable frequency oscillator signal. When the apparatus is not in phase lock, the location of the sampling pulses progress relative to the phase of the controlled oscillator signal whereby the envelope of successive output sample pulses form a "beat" signal of a frequency equal to the difference between the actual controlled oscillator frequency and $nf$. These output sample pulses are converted to biphase signals at the reference frequency on the basis of polarity by means of a tuned network and alternating current amplifier. The biphase signals are, in turn, applied to a synchronous detector together with the reference signal to generate the requisite error signals for correcting the frequency of the controlled oscillator.

The above-mentioned and other features and objects of this invention and the manner of obtaining them will become more apparent by reference to the following description taken in conjunction with the accompanying drawings, wherein.

Figure 1:
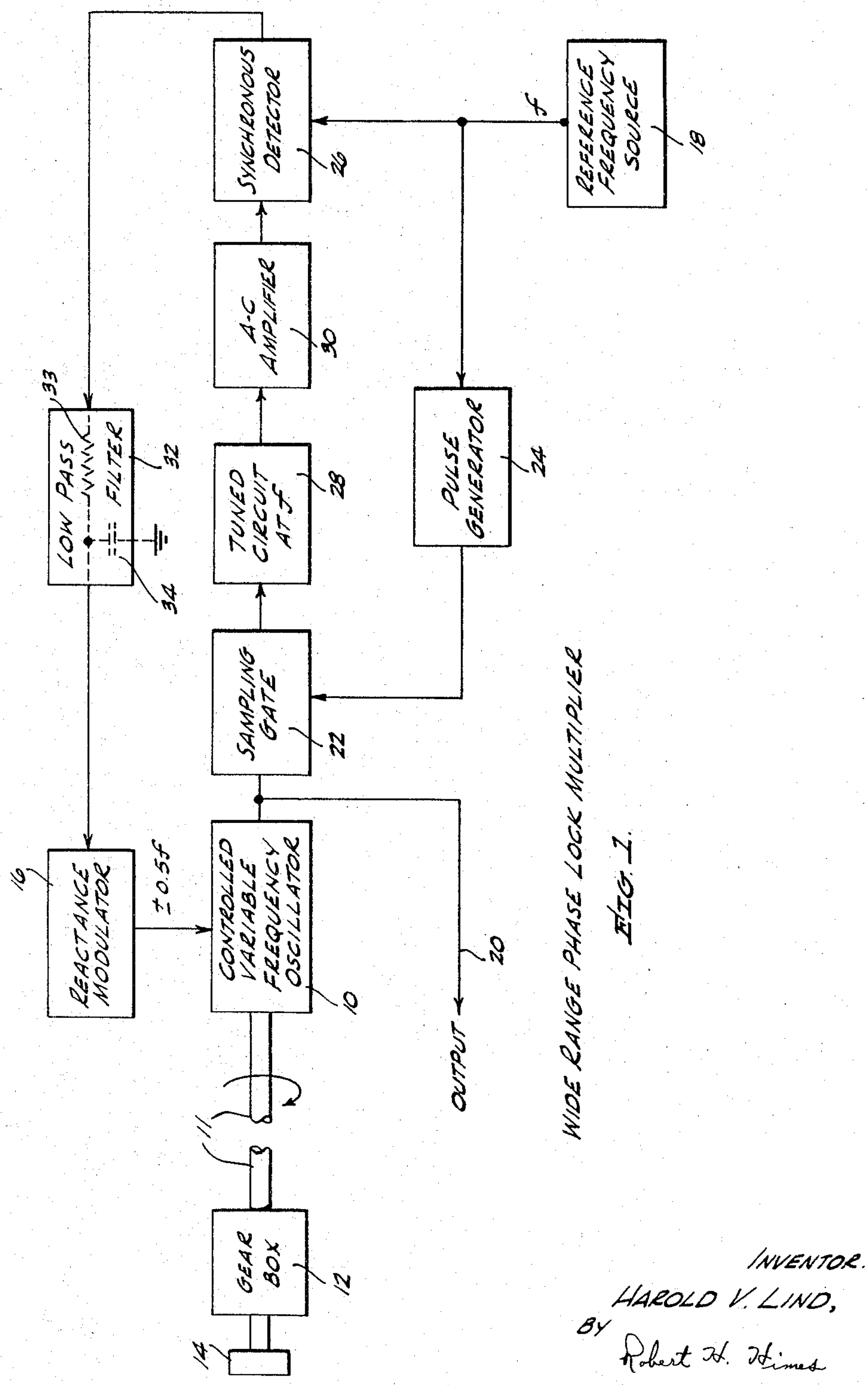
FIG. 1 illustrates a schematic block diagram of the apparatus of the present invention.

Referring now to FIG. 1 of the drawings, there is shown a preferred embodiment of the apparatus of the present invention. In particular, the apparatus includes a controlled variable frequency oscillator 10 which may be mechanically tuned by rotation of a shaft 11 which is connected through gear box 12 to a knob 14. In addition, the controlled variable frequency oscillator 10 may be electrically tuned by means of an appropriate connection from a reactance modulator 16. For reasons which will be hereinafter explained, the reactance modulator 16 is designed to electrically tune the controlled variable frequency oscillator 10 through no more than $\pm0.5f$ where $f$ is the frequency of the output signal from a reference frequency source 18. The output signal from the controlled variable frequency oscillator 10 available over a lead 20 constitutes the output from the wide range phase lock multiplier apparatus of the present invention. In addition, the output signal from controlled variable frequency oscillator 10 is applied to the input of a sample gate 22. Sampling gate 22 samples both amplitude and polarity of the applied signal during intervals controlled by sampling pulses applied thereto from a pulse generator 24. Pulse generator 24 is designed to generate one pulse during each cycle of the signal applied thereto from the reference frequency source 18. In addition to synchronizing the pulse generator 24, the signal from reference frequency source 18 is applied to a synchronous detector 26. A synchronous detector is characterized by the fact that its output may be either positive or negative, depending upon the relative phase of the two input signals, and also that only signals that are coherent with the reference input can give any output.

The output from a sampling gate 22 is applied across a tuned circuit 28 which is parallel resonant at the reference frequency of reference frequency source 18. The voltage developed across tuned circuit 28 is amplified by an alternating current amplifier 30 and applied to the remaining input of the synchronous detector 26. The output signal developed by synchronous detector 26 is passed through a low pass filter 32 and applied to the reactance modulator 16. Low pass filter 32 constitutes "a smoothing circuit" and may, for example, constitute a series resistor 33 shunted to ground on the output side by a capacitor 34.

Figure 2:
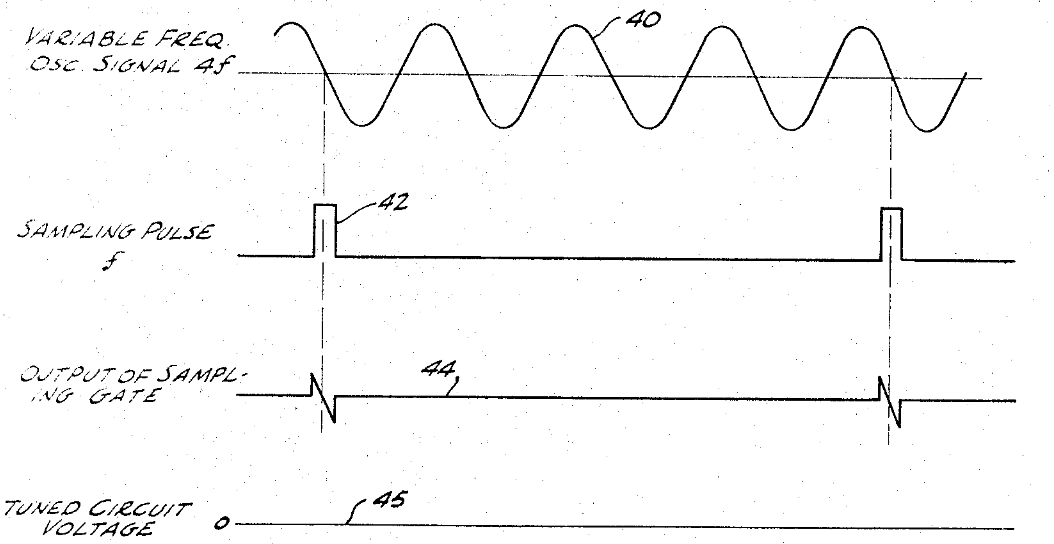
FIG. 2 shows voltage characteristics of the apparatus of FIG. 1 when in phase lock.

Referring now to FIG. 2 there is shown characteristic voltage waveforms of the apparatus of FIG. 1 when the phase lock multiplier is in phase lock. In particular, a waveform 40 illustrates an output signal from controlled variable frequency oscillator 10 which is four times the frequency $f$ of the signal generated by reference frequency source 18. Thus sampling pulses, illustrated by waveform 42, occur once during each four complete alternations of the waveform 40. Output from the sampling gate 22 constitutes that portion of the waveform 40 which is concurrent with the sampling pulse 42. When in phase lock, the controlled oscillator 10 is automatically adjusted so that the output signal crosses through zero during the duration of the sampled pulses 42. Thus, only the portion of waveform 40 commencing before the cross-over and ending an equal time after the cross-over appears at the output of the sampling gate 22. This output is illustrated by waveform 44, FIG. 2. Inasmuch as the deviations from zero of waveform 44 are equal in both the positive and negative directions, the net energy applied to tuned circuit 28 is zero. Under these circumstances, a zero amplitude signal, illustrated by a waveform 45, is generated across the tuned circuit 28, whereby no error signals appear at the output of synchronous detector 26.

Figure 3:
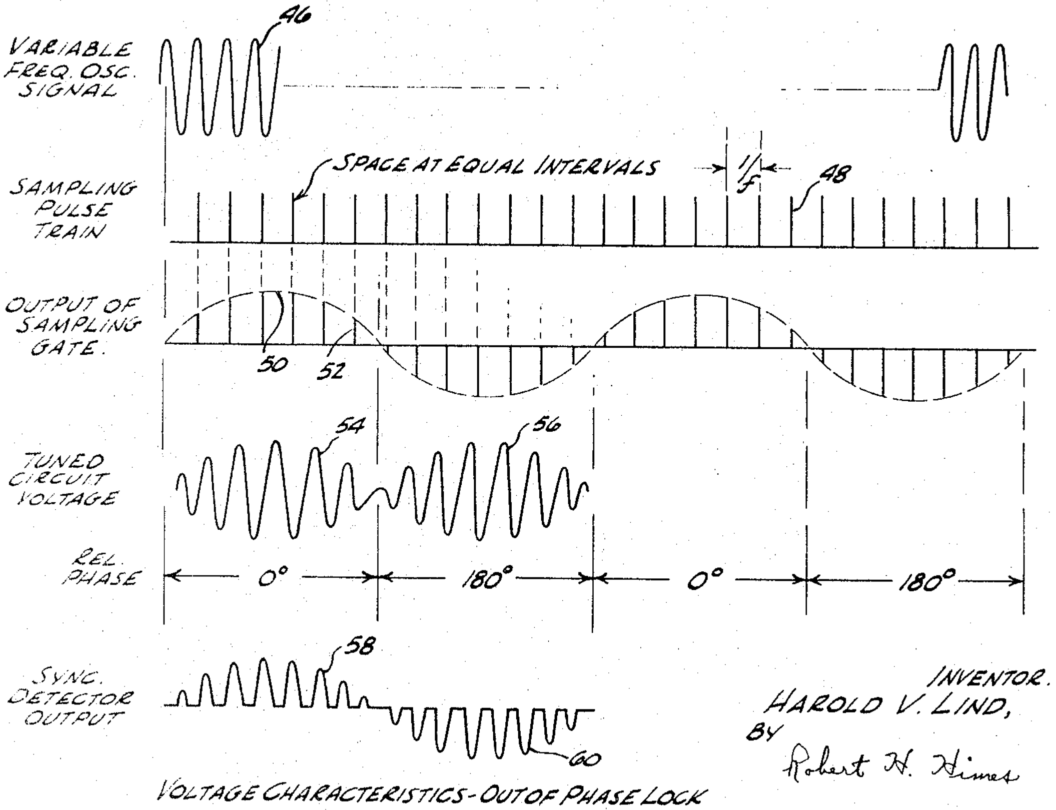
FIG. 3 shows voltage characteristics of the apparatus of FIG. 1 when out of phase lock.

Referring to FIG. 3, there are shown voltage waveforms of the phase lock multiplier of FIG. 1 when out of phase lock. The controlled variable frequency oscillator 10 is adjusted to generate the sinusoidal signal illustrated by waveform 46 FIG. 3. The pulse generator 24 on the other hand, is generating a series of sample pulses illustrated by waveform 48 at intervals equal to $1/f$. It is assumed that the frequency of waveform 46 is approximately but not exactly equal to $nf$, where $n$ is the positive integer which makes the approximation most nearly correct. Under these circumstances, the amplitude and polarity of the sample pulses appearing at the output of sampling gate 22 precess along the waveform 46 in a manner such that the envelope illustrated by dashed line 50 of the sample pulses illustrated by waveform 52 will "beat" at the difference frequency. During the positive alternation of the beat waveform 50, the sample pulses 52, when applied to the tuned circuit 28 generate a signal represented by waveform 54 having a repetition frequency $f$ and a relative phase of zero degrees. During negative alternations of beat waveform 50, however, the sample pulses 52 are negative and hence generate a signal across tuned circuit 28 represented by waveform 56 which have a relative phase of 180°. Upon applying the waveform 54 of zero degree relative phase to synchronous detector 26, a series of pulses of positive polarity represented by waveform 58 appear at the output thereof. Upon occurrence of waveform 56, however, the relative phase shifts to 180° whereby the output of synchronous detector 26 constitutes a series of negative pulses represented by waveform 60. The waveforms 58, 60 are smoothed by the low pass filter 32 whereby they constitute direct-current error signals and are applied to reactance modulator 16. In order to provide an unambiguous output signal on lead 20 the reactance modulator is designed to shift the frequency of the controlled oscillator 10 through only $\pm.5f$, the frequency of reference frequency source 18. With this limitation there is only one frequency that can be generated for any one setting of the controlled oscillator 10 by means of the knob 14. As the frequency of the controlled oscillator 10 approaches a frequency equal to $nf$, where $n$ is any positive integer, the amplitude of the voltage waveforms 58, 60 decreases to zero whereby no further correction of the oscillator 10 occurs. Further, multiples $(n\pm1/3)$ or $(n\pm1/2)$ of the reference frequency, $f$, will always produce a beat with the output signal from the controlled variable frequency oscillator 10, i.e., waveform 50, FIG. 3, will have a finite amplitude whereby error signals are generated which will shift the frequency of controlled oscillator 10 to the nearest multiple of the reference frequency, $f$.

Although the invention has been shown in connection with a certain specific embodiment, it will be readily apparent to those skilled in the art that various changes in form and arrangement of parts may be made to suit requirements without departing from the spirit and scope of the invention.

What is claimed is:

1. A phase lock multiplier apparatus comprising means for providing a reference signal of a predetermined frequency; means including a variable frequency oscillator for providing variable frequency oscillations capable of being controlled physically and electrically; means responsive to direct-current error signals of positive or negative polarity and connected to said variable frequency oscillator for electrically controlling the frequency thereof; means responsive to said reference signal of predetermined frequency for periodically sampling said variable frequency oscillations at a rate equal to said predetermined frequency; means for converting said samples of said variable frequency oscillations into biphase oscillations at said predetermined frequency, said phase being determined by the polarity of said respective samples; means responsive to said reference signal and to said biphase oscillations for converting said biphase oscillations into unidirectional electrical excursions of a polarity determined by the phase thereof relative to that of said reference signal; and means for smoothing said unidirectional electrical excursions thereby to provide said direct-current error signals of positive or negative polarity whereby said variable frequency oscillations are controlled to be at a frequency equal to an integral number of times said predetermined frequency.

2. The phase lock multiplier apparatus as defined in claim 1 wherein said means responsive to direct-current error signals of positive or negative polarity and connected to said variable frequency oscillator for electrically controlling the frequency thereof is limited to a frequency range of no more than said predetermined frequency.

3. The phase lock multiplier apparatus as defined in claim 1 wherein said means for converting said samples of said variable frequency oscillations into biphase oscillations at said predetermined frequency includes a network responsive to said samples of said variable frequency oscillations that is parallel resonant at said predetermined frequency and an alternating-current amplifier having input terminals connected across said network.

4. A phase lock multiplier apparatus comprising means for providing a reference signal of a predetermined frequency; a variable frequency oscillator for providing oscillations capable of being controlled physically and electrically; a reactance modulator responsive to direct-current error signals of positive or negative polarity and connected to said variable frequency oscillator for electrically controlling the frequency thereof through a frequency range equal to no more than said predetermined frequency; a pulse generator responsive to said reference signal for generating sampling pulses at a rate equal to said predetermined frequency; a sampling gate responsive to said variable frequency oscillations and to said sampling pulses for periodically sampling the amplitude and polarity of said variable frequency oscillations at a rate equal to said predetermined frequency; a network responsive to said periodic samples of said variable frequency oscillations, said network being parallel resonant at said predetermined frequency thereby to convert said samples into biphase oscillations at said predetermined frequency; an alternating-current amplifier having an input circuit connected across said network for amplifying said biphase oscillations; a synchronous detector responsive to said amplified biphase oscillations and to said reference signal for converting said biphase oscillations into unidirectional electrical pulses of a polarity determined by the phase thereof relative to that of said reference signal; and a low pass filter connected to the output of said synchronous detector for smoothing said unidirectional electrical pulses thereby to provide said direct-current error signals of positive or negative polarity whereby said variable frequency oscillations are controlled to oscillate at a frequency equal to an integral number times said predetermined frequency.

No references cited.

ROY LAKE, *Primary Examiner.*

S. H. GRIMM, *Assistant Examiner.*